US012153079B2

(12) United States Patent
Dase et al.

(10) Patent No.: US 12,153,079 B2
(45) Date of Patent: Nov. 26, 2024

(54) IDENTIFYING CONDUCTOR BREAKS BY DETECTING SERIES ARCING

(71) Applicant: Schweitzer Engineering Laboratories, Inc., Pullman, WA (US)

(72) Inventors: Kanchanrao Gangadhar Dase, Pullman, WA (US); James Burton Colwell, Pullman, WA (US); Matchyaraju Alla, Lewis Center, OH (US); Shreenivas Pai, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 127 days.

(21) Appl. No.: 18/301,713

(22) Filed: Apr. 17, 2023

(65) Prior Publication Data

US 2023/0333153 A1   Oct. 19, 2023

Related U.S. Application Data

(60) Provisional application No. 63/363,169, filed on Apr. 18, 2022.

(51) Int. Cl.
*G01R 31/08* (2020.01)
*G01R 19/165* (2006.01)

(52) U.S. Cl.
CPC ..... *G01R 31/085* (2013.01); *G01R 19/16571* (2013.01)

(58) Field of Classification Search
CPC ............ G01R 31/085; G01R 19/16571; G01R 19/2513; G01R 31/12; G01R 31/54; H02H 1/0015; H02H 5/10
See application file for complete search history.

(56) References Cited

U.S. PATENT DOCUMENTS 4,297,740 A   10/1981   Hagberg
4,347,542 A    8/1982   Calhoun
(Continued)

FOREIGN PATENT DOCUMENTS

CN    1601848      3/2005
CN   101699301    4/2010
(Continued)

OTHER PUBLICATIONS

Y. Yin, H. Bayat, N. Dunn M. Leyba, M. Webster, A. Marquez, K. Tran, and A. Torres, "High-speed Falling Conductor Protection for Electric Power Transmission Systems," 49th Annual Western Protective Relay Conference, Spokane, Washington, Oct. 11-15, 2022.
(Continued)

*Primary Examiner* — Jermele M Hollington
*Assistant Examiner* — Zannatul Ferdous
(74) *Attorney, Agent, or Firm* — Richard M. Edge

(57) ABSTRACT

Disclosed herein are systems for determining a broken conductor condition in a multiple-phase electric power delivery system. It has been observed that broken conductors pose a safety concern when occurring in the presence of people or vulnerable environmental conditions. Broken conductor conditions disclosed herein may be used to detect and trip the phase with the broken conductor, thus reducing or even eliminating the safety risk. Broken conductors may be determined using detected phase series arcing differences in one phase without commensurate differences in other phases. In various embodiments the phase series arcing attributes may be phase current monitored for decrement and/or phase resistance monitored for increase.

20 Claims, 9 Drawing Sheets

(56) References Cited

U.S. PATENT DOCUMENTS

| | | | |
|---|---|---|---|
| 4,357,644 | A | 11/1982 | Schmidt |
| 4,600,961 | A | 7/1986 | Bishop |
| 5,883,578 | A | 3/1999 | Roberts |
| 6,453,248 | B1 | 9/2002 | Hart |
| 6,573,726 | B1 | 6/2003 | Roberts |
| 6,833,711 | B1 | 12/2004 | Hou |
| 7,720,619 | B2 | 5/2010 | Hou |
| 7,945,400 | B2 | 5/2011 | Hou |
| 8,289,668 | B2 | 10/2012 | Kasztenny |
| 8,321,162 | B2 | 11/2012 | Labuschagne |
| 8,581,723 | B2 | 11/2013 | Schweitzer |
| 8,942,954 | B2 | 1/2015 | Gong |
| 9,160,158 | B2 | 10/2015 | Schweitzer |
| 9,217,775 | B2* | 12/2015 | Mousavi ............ G01R 31/3274 |
| 9,413,156 | B2 | 8/2016 | O'Brien |
| 9,509,399 | B2 | 11/2016 | Kasztenny |
| 9,568,516 | B2 | 2/2017 | Gubba Ravikumar |
| 10,340,684 | B2 | 7/2019 | Sridharan |
| 10,823,777 | B2 | 11/2020 | Dase |
| 11,143,715 | B2 | 10/2021 | Bell |
| 2004/0107025 | A1* | 6/2004 | Ransom ................. G06Q 50/06 700/286 |
| 2004/0158360 | A1* | 8/2004 | Garland, II ............... H02J 3/38 700/286 |
| 2005/0057212 | A1 | 3/2005 | Harbaugh |
| 2005/0231871 | A1 | 10/2005 | Karimi |
| 2007/0055889 | A1 | 3/2007 | Henneberry |
| 2008/0031520 | A1 | 2/2008 | Hou |
| 2008/0211511 | A1 | 9/2008 | Choi |
| 2011/0075304 | A1 | 3/2011 | Hamer |
| 2012/0063040 | A1 | 3/2012 | Rostron |
| 2012/0068717 | A1 | 3/2012 | Gong |
| 2012/0161684 | A1 | 6/2012 | Tiwari |
| 2012/0330582 | A1 | 12/2012 | Wiszniewski |
| 2013/0107405 | A1 | 5/2013 | Blumschein |
| 2013/0221976 | A1 | 8/2013 | Blumschein |
| 2014/0028116 | A1 | 1/2014 | O'Brien |
| 2015/0124358 | A1 | 5/2015 | Hulse |
| 2016/0041216 | A1 | 2/2016 | Tang |
| 2016/0091537 | A1 | 3/2016 | Gaarder |
| 2016/0266193 | A1 | 9/2016 | Ennis |
| 2016/0299187 | A1 | 10/2016 | Liang |
| 2016/0308349 | A1 | 10/2016 | Sridharan |
| 2017/0315168 | A1 | 11/2017 | Benmouyal |
| 2018/0284180 | A1 | 10/2018 | Ha |
| 2019/0317143 | A1 | 10/2019 | Dase |
| 2020/0011908 | A1* | 1/2020 | Bickel ................. H02J 13/0004 |
| 2022/0299557 | A1 | 9/2022 | Yin |

FOREIGN PATENT DOCUMENTS

| | | |
|---|---|---|
| CN | 102608491 | 7/2012 |
| CN | 102694375 | 9/2012 |
| CN | 102696161 | 9/2012 |
| CN | 103308823 | 9/2013 |
| CN | 104730410 | 6/2015 |
| CN | 204462305 | 7/2015 |
| CN | 105738751 | 7/2016 |
| CN | 106908692 | 6/2017 |
| CN | 105207176 | 7/2017 |
| CN | 109324269 | 2/2019 |
| CN | 109975661 | 7/2019 |
| WO | 2007086944 | 8/2007 |
| WO | 2014018909 | 1/2014 |
| WO | 2019229638 | 12/2019 |

OTHER PUBLICATIONS

Y. Yin, N. Dunn, H. Kruger, H. Bayat, M. Leyba, A. Marquez, A. Torres, I. Sanchez, K. Tran, and M. Webster, "High-speed Falling Conductor Protection in Distribution Systems using Synchrophasor Data," 49th Annual Western Protective Relay Conference, Spokane, Washington, Oct. 11-15, 2022.

Dase, Kanchanrao; Colwell, James; Pai, Shreenivas: "Novel Methods for Detecting Conductor Breaks in Power Lines" 76th Annual Conference for Protective Relay Engineers, Mar. 27-30, 2023.

William O'Brien, et Al. "Catching Falling Conductors in Midair—Detecting and Tripping Broken Distribution Circuit Conductors at Protection Speeds" Presented at the 42nd Annual Western Protective Relay Conference, Oct. 2015.

Kanchanrao Dase and Normann Fischer, "Computationally Efficient Methods for Improved Double-Ended Transmission Line Fault Locating" Originally Presented at the 45th Annual Western Protective Relay Conference, Oct. 2018.

\* cited by examiner

IDENTIFYING CONDUCTOR BREAKS BY DETECTING SERIES ARCING

RELATED APPLICATION

This application claims benefit under 35 U.S.C. § 119 (e) of U.S. Provisional Patent Application No. 63/363,169, filed on 18 Apr. 2022, and entitled "Broken Conductor Detection Through Series Arcing" naming Kanchanrao Gangadhar Dase, James Colwell, Matchyaraju Alla, and Shreenivas Pai as inventors, which is herein incorporated by reference in its entirety and for all purposes.

TECHNICAL FIELD

This disclosure relates to identifying conductor breaks in an electric power delivery system. More particularly, this disclosure relates to detecting a broken conductor by detecting series arcing attribute differences in one phase but not the other phases. In several embodiments, the series arcing attribute is current magnitude monitored for decrements. In several embodiments, the series arcing attribute is arc resistance monitored for increases.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
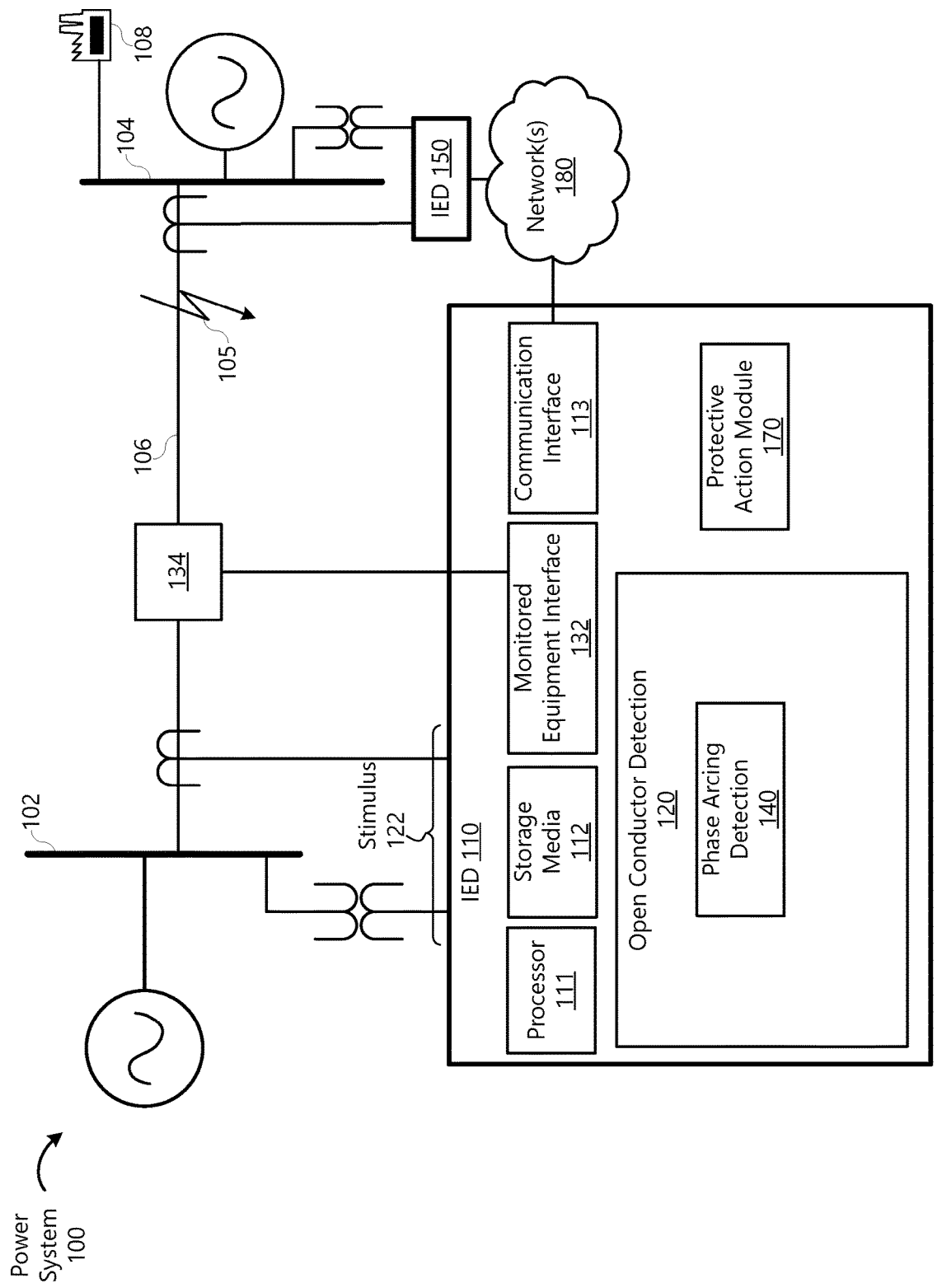
FIG. 1 illustrates a simplified one-line diagram of an electric power delivery system for providing electric power to loads including a system for detecting a broken conductor of the electric power delivery system.

Power line conductors gradually weaken as they are exposed to environmental conditions and natural or human-caused mechanical stresses. If not repaired or replaced, these conductors may eventually break and fall to the ground. The subsequent shunt fault and reclosing attempts may cause stress on the power system and shorten the life span of the equipment feeding the fault. Moreover, broken conductors that are still energized when they contact combustible objects such as vegetation or structures may ignite wildfires, endangering lives and property. Therefore, detecting broken conductors before they fall to the ground is essential.

Previous attempts at detecting a broken conductor condition have proven to lack speed and/or reliability. For example, detection of a broken conductor using unbalance (e.g. ratio of negative-sequence current and positive-sequence current) requires that the unbalance condition persist for 5-60 seconds. Due to the time required, the unbalance technique has limited effectiveness for protection and is mainly used for providing an alarm. In another example, high-impedance faults may be detected using signatures in measured signal quantities. However, high-impedance fault detection requires that the energized conductor make electrical contact with the high-impedance object (such as the ground, vegetation, or the like). Because the conductor must make contact with the object, this method is also of limited effectiveness for detecting the break before the conductor contacts the ground. Furthermore, not all conductor breaks convert to high-impedance events, and are, therefore, not detected using high-impedance fault detection methods.

What is needed is a system and a method for detecting a broken conductor condition that is fast and effective. Presented herein are embodiments that detect broken conductors using a phase series arcing attribute. The phase series arcing attribute may be monitored for differences in one phase but commensurate differences not occurring in the other phases. The differences monitored may indicate a trend, and may be monitored as incremental, overall, or the like. In various embodiments, the phase series arcing attribute comprises a current magnitude and the difference is reduction in current magnitude. The difference over time may be considered to be a trend that indicates a series arcing event. In various other embodiments, the phase series arcing attribute comprises a phase resistance and the difference is increase in phase resistance. The difference over time may be considered to be a trend that indicates a series arcing event. Embodiments herein are capable of detecting the series arcing event in less than 600 ms, whereas conductor breaks typically take more than one second for the conductor to reach the ground. Embodiments herein distinguish between several non-fault events and conductor breaks, and are also configurable to bias toward additional security if desired.

Embodiments herein analyze the arc initiated by a conductor break to detect the broken conductor condition. Once the arc initiates from the conductor breaks, the sustenance of the arc is a function of arc voltage, loading current, electric field, arc temperature, and varying levels of ionization of the air. As used periodically herein, the occurrence of the arc caused by a physical discontinuity in the circuit is referenced to as series arcing. There are several examples of physical discontinuities in circuits: conductor break, opening of a load interrupting disconnect switch, or opening of circuit breaker pole. Accordingly, it is important to distinguish between planned (e.g. opening of a circuit breaker) and unplanned (e.g. conductor break) arcing events.

The series arc acts as a medium through which the current continues to flow until the arc extinguishes and interrupts the current. For a broken conductor condition, as the distance between the broken conductor ends increase, the series arc length is expected to increase, increasing the arc resistance. This series arc can be electrically represented as variable resistance at the broken conductor location in series with the affected phase line impedance.

Series arcing introduces increasing arc resistance that causes reduction in the current magnitude of the affected phase. Various embodiments herein determine a phase series arcing attribute for each phase to determine the broken conductor condition. Phase series arcing attributes may include, for example, decrements of the phase current magnitude and increasing values of phase resistance. Other phase series arcing attributes that may be monitored to determine an open conductor condition in accordance with several embodiments herein include impedance (e.g. by monitoring incremental real-time impedance or comparing a present impedance against a memory impedance value), time domain current measurements (e.g. time-domain current analogs), sequence currents (e.g. increase in negative-sequence current $I_2$ and/or zero-sequence current $I_0$ while the positive-sequence current $I_1$ decreases), and the like.

FIG. 1 illustrates a simplified one-line diagram of an electric power delivery system 100 including power system protection that may be used to detect conductor breaks in accordance with several embodiments herein and remove power from power system equipment. It should be noted that the system includes multiple phases and may include additional equipment and complexity. Also illustrated are IEDs 110 and 150 that may obtain electric power system information either directly or from merging units (MUs), and effect control actions on the electric power system to provide protection and automation to the electric power delivery system. Various embodiments herein may perform single-ended broken conductor detection that does not require communication between IEDs 110, 150, and only relies on measurements from one location. Other embodiments may use measurements from both IEDs 110, 150 at the different locations on the power system.

The power system includes various equipment such as buses 102 and 104 electrically connected by one or more transmission lines 106. Various feeders may receive electric power from the second bus 104 via appropriate transformers and breakers for delivering electric power to distributed loads 108. Circuit breakers, such as circuit breaker 134 may be used to selectively connect and disconnect portions of the power system for various purposes such as reconfiguration, protection in the event of a fault, or the like. One or both of the buses 102, 104 may receive electric power from supplies such as generators, generation stations, transmission lines, and the like.

An IED 110 may be in communication with the electric power delivery system and configured to determine phase series arcing attributes of all phases, and detect a broken conductor on one phase of the multiple-phase system using the phase series arcing attributes of all phases. IED 110 may obtain measurements from the electric power delivery system using a stimulus input 122. The stimulus input may be in communication with current transformers (CTs) to obtain current measurements, potential transformers (PTs) to obtain voltage measurements, or other such instrument transformers or similar devices to obtain measurements from the power system. Signals obtained may be filtered and sampled to produce digitized analog signals. In various embodiments, the stimulus input may be in communication with one or more merging units to obtain digitized analog signals from the electric power delivery system. Such digitized analog signals may be provided to a processor 111. The IED 110 may be in communication with a circuit breaker 122 (either directly or via a merging unit) via a monitored equipment interface 132 to obtain a status therefrom (open/closed) and to send commands (trip/close) to the circuit breaker 122.

The IED may include one or more computer-readable storage media 112, embodied in one or more units, which may be packaged together with, or separately from the processor 111. The storage media 112 may be a repository of computer-readable instructions that, when executed by the processor 111 cause the IED 110 to perform certain tasks. The instructions may include open conductor detection 120. The open conductor detection 120 may include instructions for phase series arcing detection 140, to calculate the phase series arcing attributes, determine series arcing conditions, and determine which phase includes the broken conductor. The open conductor detection module 120 may include instructions to signal the protective action module such that the IED 110 can effect a protective action upon determination of a broken conductor condition.

IED 110 may include a protective action module 170 (which may be embodied as computer instructions on storage media 112) to determine whether to trip the circuit breaker, and to send an open/trip signal to the circuit breaker 122 via the monitored equipment interface 132. The protective action module 170 may determine to signal the circuit breaker to open upon receiving the broken conductor indication from the open conductor detection module 120.

IED may further include a communication interface 113 in communication with one or more devices or systems via network 180. The communication interface 113 may be used to transmit signals that include measurements, states, and commands that are made or determined by IED 110 to other systems and devices; as well as receiving measurements, states, and commands from other devices such as IED 150. IED 150 may be configured similarly to IED 110.

When a physical break occurs in a current-carrying conductor, an arc forms at the break point. Once the series arc is initiated in the air, the arc voltage, loading current, electric field, arc temperature, and ionization of air all contribute to sustaining the arc. Circuit breakers, load-interrupting disconnect switches, or conductor breaks may initiate series arcing while interrupting the current. The mechanism of the arc extinction is different for circuit breakers compared to that of load-interrupting disconnect switches or conductor breaks because of the dielectric medium. However, the theory of arc extinctions through a load-interrupting disconnect switch or conductor break are similar. The main difference is the speed at which the ends of the series arc separate. In case of free-falling broken conductor, the linear distance between the ends of the series arc may increase faster than the distance between the contacts of an opening disconnect switch.

Figure 2:
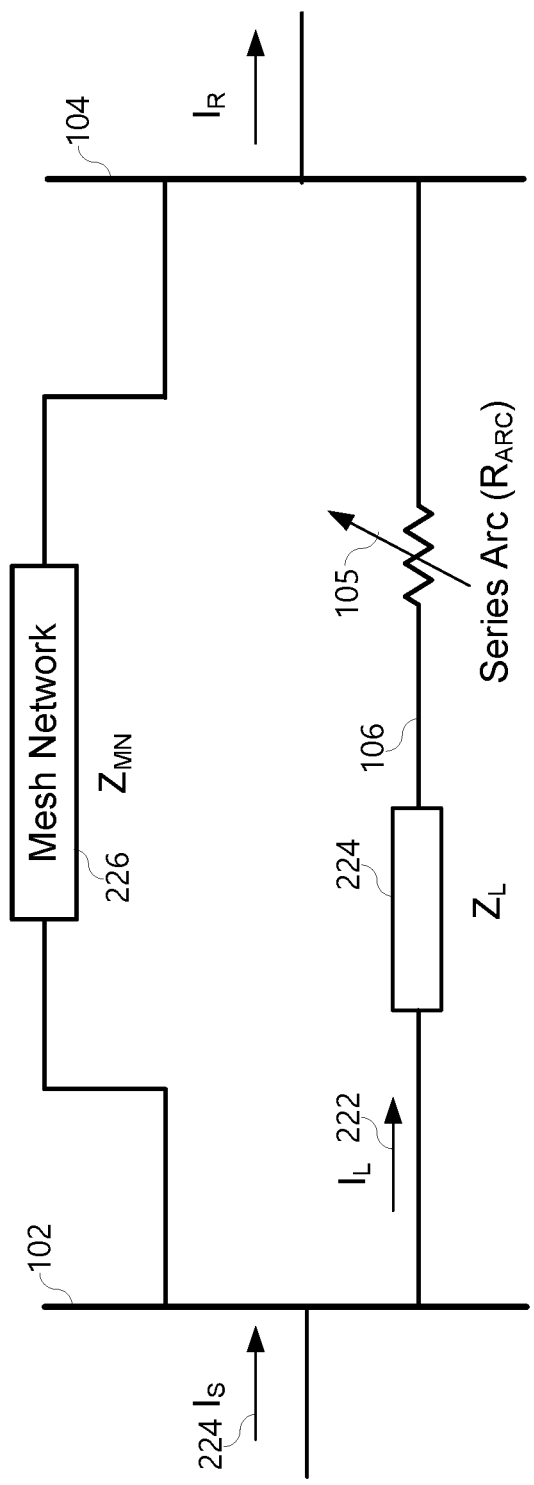
FIG. 2 illustrates a simplified component diagram of a power system broken conductor under series arcing.

FIG. 2 illustrates a simplified component diagram of a power system broken conductor under series arcing. As illustrated, the power line 106 is in parallel with the mesh network 226. Consider an occurrence of series arcing caused by a conductor break 105 in the power line. This series arcing is represented as a variable resistance $R_{ARC}$. Typically, the grid loading is not affected by the open-phase conditions occurring in power lines. In FIG. 1, if an open phase occurs in the power line, the respective phase current is redistributed through the mesh network such that there is no change in the incoming current ($I_S$ 224) and the outgoing current ($I_R$) before and after the open-phase condition.

When a power line 106 is healthy, Equation 1 is true:

$$(I_S - I_{L\_BCB}) \cdot Z_{MN} = I_{L\_BCB} \cdot Z_L \qquad \text{Eq. 1}$$

where:
$I_S$ is the incoming current;
$I_R$ is the outgoing current;

$I_{L\_BCB}$ is the steady state current through the power line before the conductor break in the line;
$Z_{MN}$ is the mesh network equivalent impedance 226; and
$Z_L$ is the line impedance 224.

During a conductor break and the series arcing extinguishes, the open-circuit voltage $V_{ARC_{OC}}$ across the ends of the broken conductor segments can be expressed as shown in Equation 2, and the open-circuit voltage across an extinguished arc is expressed in Equation 3, and the real-time arc voltage drop VARC is expressed in Equation 4:

$$V_{ARC_{OC}} = I_S \cdot Z_{MN} \qquad \text{Eq. 2}$$

$$V_{ARC_{OC}} = I_{L_{BCB}} \cdot (Z_L + Z_{MN}) \qquad \text{Eq. 3}$$

$$V_{ARC} = I_L \cdot R_{ARC} \qquad \text{Eq. 4}$$

For a conductor break, the series arc resistance is expected to increase with time and the current through it may decrease. Experimental studies have indicated that the voltage drop across the arc takes some time to approach the voltage value. This time is related to the duration of the series arc. Therefore, the duration of series arcing may vary depending on the magnitude of the current before the conductor break, line impedance, and equivalent impedance of the parallel mesh network. Test data have shown occurrences of series arcing caused by the opening of a disconnect switch for initial current values as low as 25 A. The same could be true for the occurrences of series arcing through conductor breaks.

Embodiments herein detect the series phase arc using the phase series arcing attribute of current/decrement, arc resistance $R_{ARC}$ increase, or both.

Figure 3:
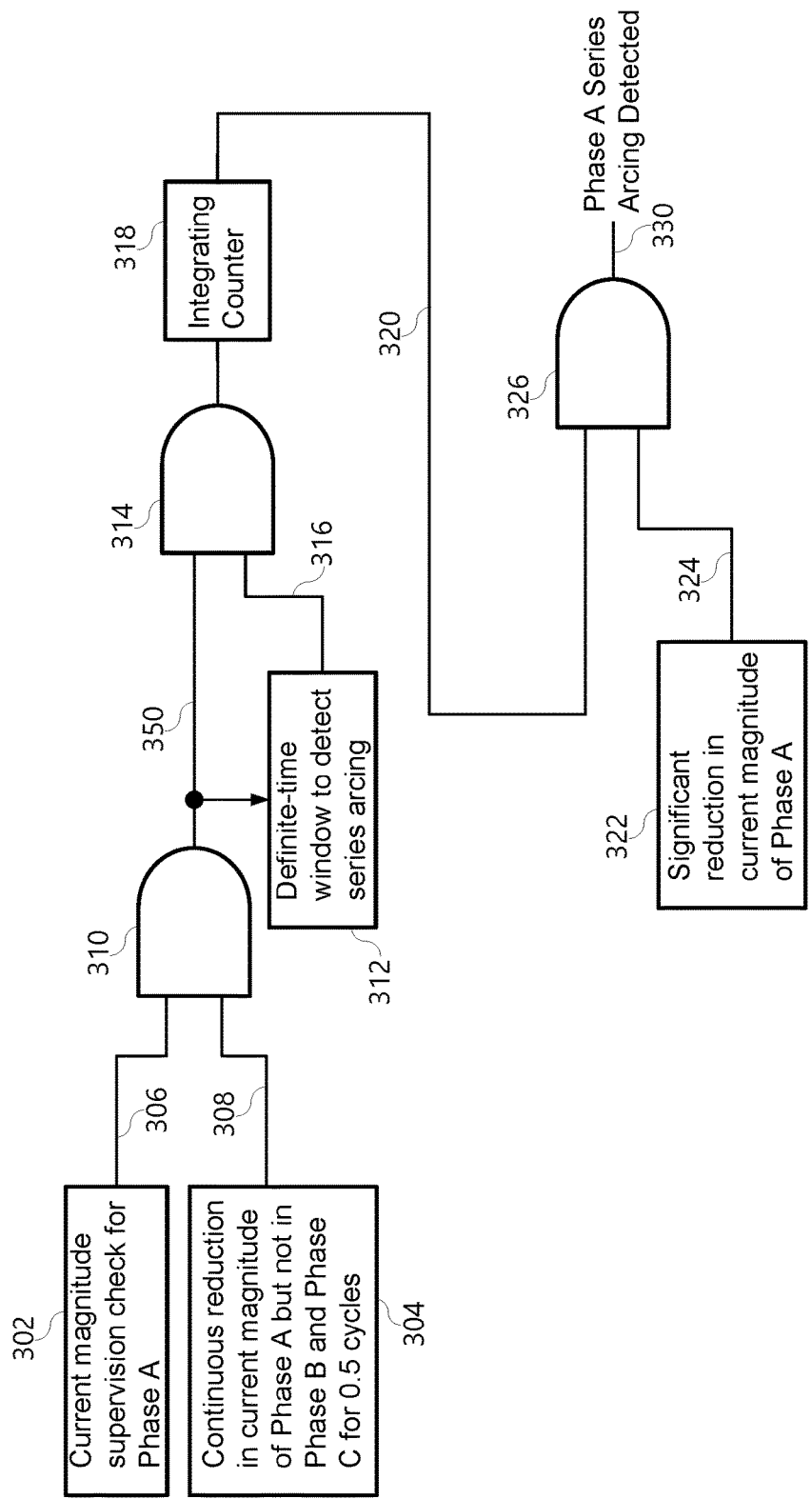
FIG. 3 illustrates a simplified logic diagram for detecting a broken conductor using current decrement.

FIG. 3 illustrates a simplified logic diagram for detecting a broken conductor using current decrement. Generally, this algorithm looks for signs of incremental reduction in the current magnitude in one of the phase currents but not in the other phases for a stipulated time 304. When the respective phase current magnitude experiences significant reduction 322 as compared to the earlier pre-faulted system current magnitude, the logic may declare detection of series arcing 330. The series arcing 330 may be used to determine an open conductor, and a protective action taken.

In accordance with several embodiments, when the current magnitude exceeds a predetermined threshold (current magnitude supervision check) for a first phase 302, signal 306 is asserted. When a continuous reduction in current magnitude of the first phase is determined, but not in the other phases for a predetermined period, then signal 308 is asserted. Upon assertion of signals 306 and 308, AND gate 310 asserts a suspected arcing phase signal 350 for the first phase (Phase A as illustrated). In various embodiments, a definite-time window is initiated 312 upon assertion of the suspected arcing phase signal 350, and the open window signal 316 is asserted. Upon assertion of the open window signal 316 and the suspected arcing phase signal 350, AND gate 314 asserts to initiate an integrating counter 318.

The integrating counter 318 asserts signal 320 when the number of assertions of the suspected arcing phase signal 350 have been asserted during the time that the definite-time window is open 316. When signal 320 is asserted and a significant reduction in current magnitude for the suspected phase 322 has been satisfied (asserting signal 324), then AND gate 326 asserts signal 330 indicating a phase series arcing condition for the suspected phase (Phase A as illustrated). Following is a more detailed description of the several element blocks illustrated in FIG. 3.

The current magnitude supervision check block 302 may compare the current magnitude against a predetermined minimum. Series arcing is more likely to occur when a conductor break or the opening of a disconnect switch interrupts the load current. A minimum threshold for the phase current magnitude may be set to filter out low loading cases. The signal 306 of the series arcing detection algorithm may require the current for the selected phase to be greater than a minimum threshold that depends on the IED sensitivity.

Block 304 detects incremental reductions in the phase current magnitude for the selected phase. The illustrated logic looks for reductions in the current magnitude of one phase with no decrement in the current magnitudes of the other two phases. When this condition, along with the minimum current supervision check 302, is satisfied for a predetermined time, e.g., 0.5 power system cycle, a definite-time window 312 opens for detecting possible series arcing. Defining the threshold to compare the incremental reductions in the phase current magnitude can be selectively configured to maintain dependability of the algorithm and avoid false assertions. In various embodiments, the minimum threshold to check the magnitude reduction may be calculated based on field events data. Note that a sudden reduction in the phase current magnitude is not expected during the series arcing caused by the conductor break. Therefore, a higher limit in the incremental drop of the phase current magnitude may be set. This can filter out cases where the current magnitudes quickly drop to zero when the circuit breaker trips the line; and the series arcing condition is not detected.

The definite-time window detecting possible series arcing 312 is open only for the phase that has decreasing current magnitude (Phase A as illustrated). The defined time for this window can encompass the duration of the series arcing, so the algorithm has enough time to detect series arcing phenomena. In various embodiments, the broken conductor may exhibit series arcing durations ranging from 0.2 to 0.7 seconds (different times may be exhibited depending on the equipment implementation). Considering this range, a definite-time window of 18 power system cycles may be selected. The definite-time window is closed upon initiation of a shunt fault or when the respective phase current magnitude falls lower than a minimum threshold (deassertion of signal 306).

The significant reduction in the phase current magnitude 322 asserts when there has been a significant drop in the phase current magnitude within the definite-time window. For the field event analysis, a reduction of 25 percent was considered. That is, the block 322 asserts when a present magnitude of phase current has decreased by 25% from an initial value. The initial value may be determined before signal 308 is asserted.

Figure 4A:
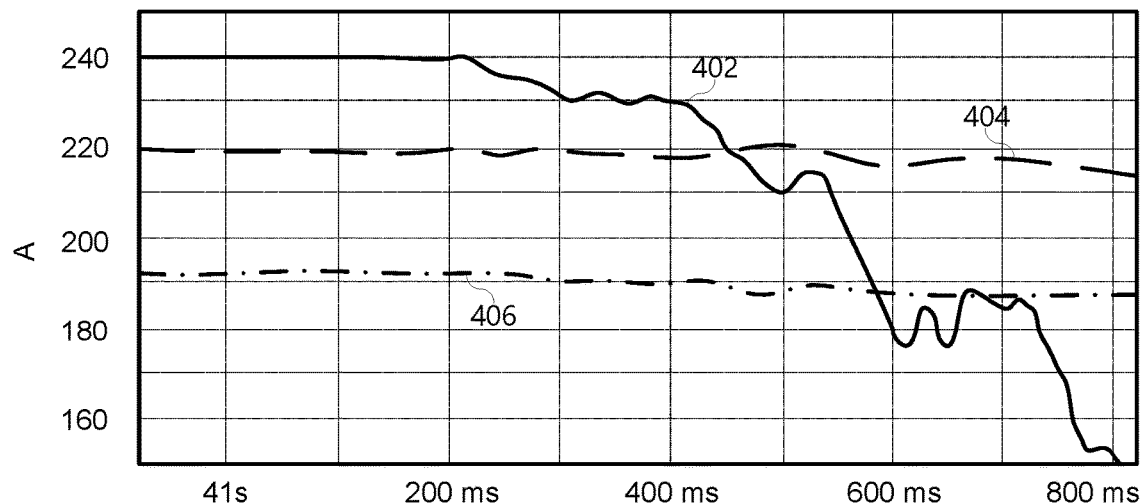
FIG. 4A illustrates a plot of phase currents during an A-phase broken conductor condition.
Figure 4B:
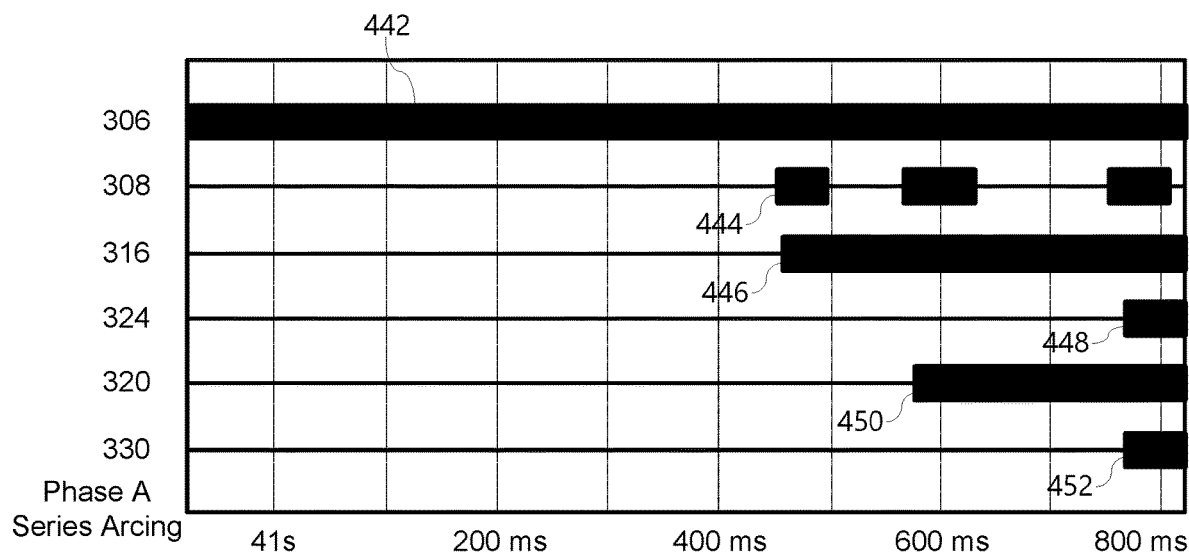
FIG. 4B illustrates a plot of logic signals during an A-phase broken conductor condition detected in accordance with several embodiments herein.

The integrating counter 318 calculates the processing counts during which signal 350 is asserted while the definite-time window 312 is open (signal 316 is asserted). The integrating counter helps to differentiate an open-phase condition caused by the opening of a breaker pole or through the extinction of series arcing caused by a conductor break. When a breaker pole opens, the corresponding phase current reduces quickly and drops to zero in less than the breaker pole-open time (two to three power system cycles), whereas the occurrence of series arcing for a conductor break causes gradual reduction in the affected phase current magnitude, (as shown in FIG. 4A for a Phase A broken conductor event). Note that signals 306 and 308 may not be continuously asserted as shown in FIG. 4B. Implementing an integrating counter instead of a normal pickup delay timer ensures the time delay in detecting series arcing condition is minimized. For the integrator counter 318, each count equals the duration of ⅛th of a power system cycle. When the integrator count 318 exceeds a threshold, the output of the integrating counter 320 asserts. The count threshold for the integrating counter 318 could be selected as greater than a number of counts required for the breaker pole to open. In various embodiments, the count threshold is selected as 24 counts.

It should be noted that the embodiment illustrated in FIG. 3 may be used to determine an arcing event on Phase A. Similar methods may be used to determine arcing events on remaining phases (e.g. Phase B, Phase C).

FIGS. 4A and 4B illustrate plots of current magnitude for each phase of a three-phase power system and assertion of signals 306, 308, 316, 320, 324, and 330 during a broken conductor event. In particular, FIG. 4A illustrates plots of current magnitude for Phase A 402, Phase B 406, and Phase C 404. It can be seen that Phase A 402 experiences a reduction in current magnitude from the initiation of the series arc event at around 200 ms, whereas the current magnitudes of the other two phases 404, 406 do not experience such a reduction in current magnitude.

Turning to FIG. 4B, the output of certain signals as illustrated in FIG. 3 is illustrated. Trace 442 is asserted for the entirety of the plot, as the current magnitude for Phase A exceeds the predetermined supervision threshold, resulting in assertion of signal 306. At around time 450 ms, signal 308 is asserted for the first time as seen in trace 444. At the same time, signal 316 asserts (trace 446) indicating that the definite-time window is open. At around time 575 ms, trace 450 indicates that the integrating counter 318 has asserted signal 320 due to a sufficient number of assertions of signal 308 while the timer is open (signal 316 and trace 446). At around 760 ms, trace 448 indicates that signal 324 asserts when the current magnitude experiences a significant reduction for the suspected phase 322. Finally, upon assertion of signals 320 and 324, trace 452 illustrates assertion of signal 330 which indicates that series arcing on phase A has been determined.

Figure 5:
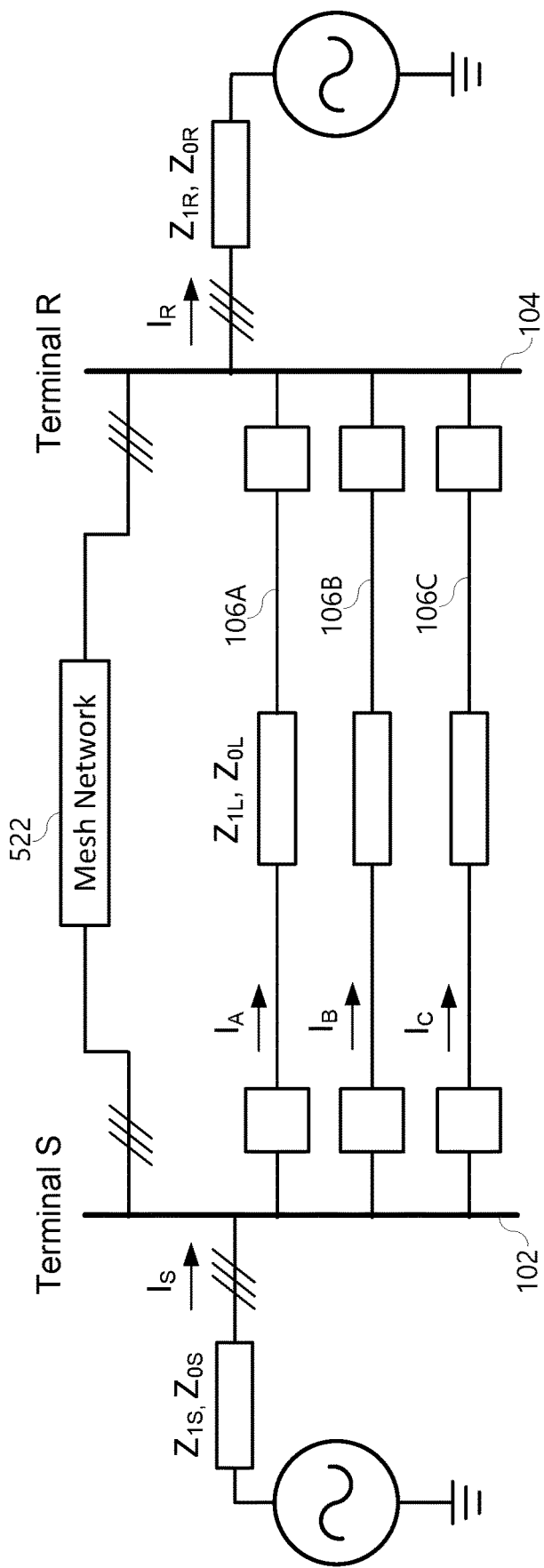
FIG. 5 illustrates a simplified component diagram of a power system.

As has been suggested above, one phase series arcing attribute that may be used to determine an arcing condition is incremental reductions in phase current magnitude; whereas another phase series arcing attribute that may be used to determine an arcing condition is increase in phase resistance values. Typically, transmission, sub-transmission, and some distribution systems consist of mesh networks. For any series faults, e.g., open-phase, in these networks, the respective phase current of the affected line is redistributed in the network, resulting in no loss of load. The redistribution of the currents for such a series fault keeps the system voltage stiff. FIG. 5 illustrates a simplified diagram that represents such a power system. In FIG. 5, if an open phase occurs in Phase A of the line, the Phase A current is redistributed through the mesh network 522, and there is no change in the currents coming into Terminal S 102 ($I_S$) and going out of Terminal R 104 ($I_R$). This also results in stiff voltages at the Terminals S 102 and R 104 for any open-phase condition on the power line. With this consideration, the following describes an approach to detect series arcing by estimating the phase resistances.

Equation 5 provides an estimated Phase A resistance of a transposed power line by using the voltage drop. For simplicity, assume no additional zero-sequence mutual couplings are linking the power line $$R_{A\_EST} = \text{Real}\left(\frac{V_{AS} - V_{AR} - (I_B + I_C) \cdot Z_M}{I_A}\right) \qquad \text{Eq. 5}$$

where:
$V_{AS}$ is the local terminal Phase A voltage;
$V_{AR}$ is the remote terminal Phase A voltage; and
$Z_M$ is the phase-to-phase mutual impedance.

Figure 6:
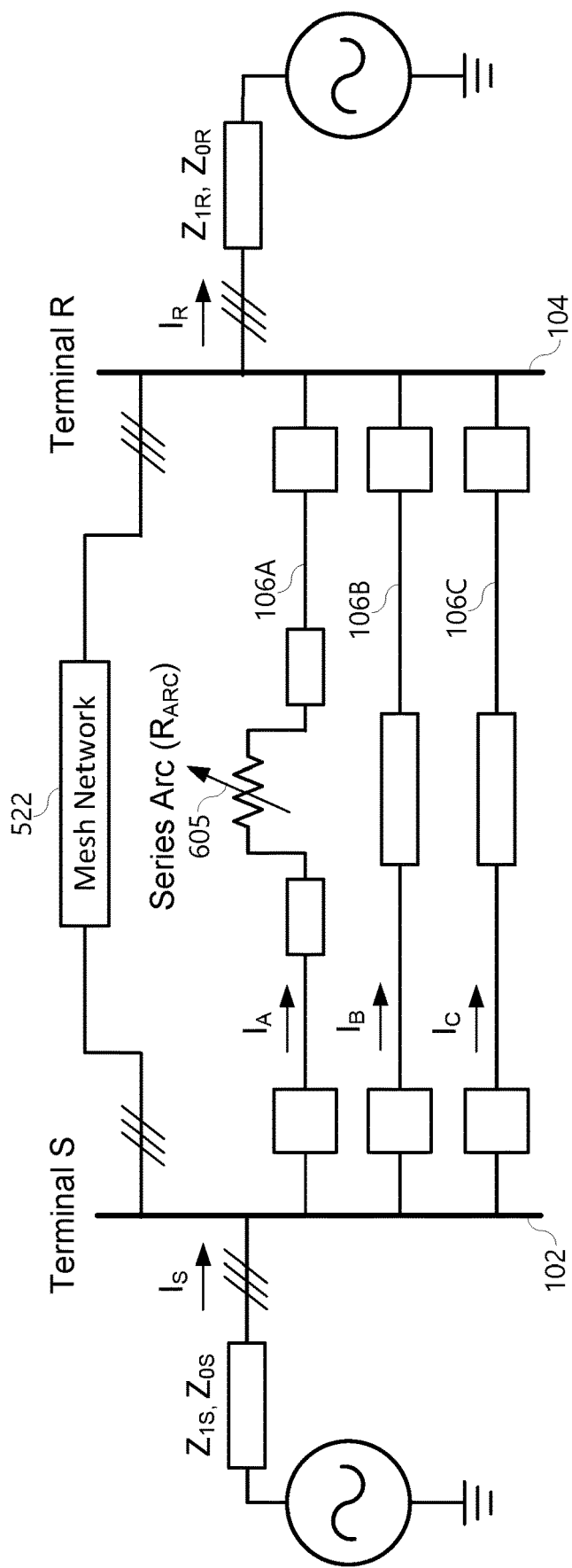
FIG. 6 illustrates a simplified component diagram of a power system under series arcing on the A-phase thereof.

FIG. 6 illustrates a simplified block diagram of a power system that shows a series arcing 605 caused by the conductor break in Phase A of the power line 106A. This series arcing 605 is represented as a variable resistance ($R_{ARC}$). As the series arcing 605 progresses in time, $R_{ARC}$ is expected to increase, because the length of the arc grows as the distance between the broken conductor ends increase. During the arcing period, the estimated phase resistance ($R_{A\_EST}$) of the power line calculated by using Equation 5 should equal to the sum of the actual resistance of Phase A ($R_A$) and the variable arc resistance ($R_{ARC}$). Under normal loading conditions (without any series arc), the estimated Phase A resistance ($R_{A\_EST}$) calculated by Equation 5 should equal to the actual resistance of Phase A ($R_A$). Therefore, by monitoring the increase in the Phase A resistance by using Equation 5, the occurrence of series arcing and thus a broken conductor can be detected. Note, Equation 5 uses synchronized local and remote measurements to detect series arcing, making the use of a multi-ended approach. In accordance with various embodiments, remote voltage measurements (from, e.g. IED 150) may provide remote voltage measurements for calculation of the arc resistance.

In accordance with certain embodiments herein, the remote voltages are not used to calculate the arc resistance. Instead, an estimated voltage is calculated to determine the increased phase resistance during the arcing condition. In accordance with such embodiments, it is assumed that the occurrence of series arcing in only one phase while the other two phases remain healthy. Given this assumption and because the arc resistance varies by length, the corresponding estimated phase resistance should increase during series arcing for a significant amount of time (e.g., three power system cycles) compared to the other two phases. Now, consider series arcing in Phase A, while Phase B and Phase C are assumed to be healthy. With this assumption, the remote terminal voltages of Phase B and C, calculated using only the local analogs and line parameters, are estimated correctly by using Equations 6 and 7, respectively:

$$V_{BR\_EST} = V_{BS} - I_{LOOP_B} \cdot Z_{1L} \qquad \text{Eq. 6}$$

$$V_{CR\_EST} = V_{CS} - I_{LOOP_C} \cdot Z_{1L} \qquad \text{Eq. 7}$$

where:
$V_{BS}$ and $V_{CS}$ are the local terminal Phase B and Phase C voltages;
$I_{LOOP_B} = I_B + k_0 \cdot I_G$ and $I_{LOOP_C} = I_C + k_0 \cdot I_G$ are the Phase B and Phase C loop currents;

$$k_0 = \frac{Z_{0L} - Z_{1L}}{3 \cdot Z_{1L}}$$

is the zero-sequence compensation factor;
$Z_{1L}$ is the positive-sequence line impedance; and
$Z_{0L}$ is the zero-sequence line impedance Using Equations 6 and 7, the remote terminal Phase A voltage may be calculated as illustrated in Equation 8:

$$V_{AR\_EST} = V_{GR\_EST} - (V_{BR\_EST} + V_{CR\_EST}) \qquad \text{Eq. 8}$$

where $V_{GR\_EST}$ is the remote terminal ground voltage.

Typically, power systems networks have stiff and balanced voltages, making the ground voltage too small to consider. However, if there is significant ground voltage before an open phase occurs, it cannot be ignored. For such cases, calculate $V_{GR\_EST}$ by using Equation 9.

$$V_{GR\_EST} = V_{GL} - I_G \cdot Z_{0L} \quad \text{Eq. 9}$$

where:

$V_{GL}$ is the local terminal ground voltage; and
$I_G$ is the ground current through the affected power line.

When the changing series arcing resistance ($R_{ARC}$) is introduced in one phase of the line, additional ($R_{ARC}/3$), in parallel with the positive- and negative-sequence network, is also introduced in the zero-sequence impedance of the line. Therefore, using Equation 9 to estimate $V_{GR\_EST}$ will be erroneous from the instance of physical break in the conductor. However, $V_{GR\_EST}$ can be approximated by latching to its value from a time just before the conductor break. Therefore, Equation 8 can be re-written as Equation 10:

$$V_{AR\_EST}' = V_{GR\_EST}|_{BCB} - (V_{BR\_EST}' + V_{CR\_EST}') \quad \text{Eq. 10}$$

where $V_{GR\_EST}|_{BCB}$ is the latched value from a time just before the conductor break.

The assumption of latching $V_{GR\_EST}$ is true for power systems that have stiff voltages for an open-phase event in the power line. Accurate estimation of the series arc resistance requires accurate $V_{GR\_EST}$. However, the proposed detection method looks at the trend, especially the variation of the estimated phase resistance rather than for its accuracy. Considering this and using $V_{AR\_EST}'$ from Equation 10 in place of $V_{AR}$ in Equation 5, an estimated resistance of Phase A $R_{A\_EST}'$ may be expressed as shown in Equation 11. Equation 11 contains only the local analogs and line parameters, making it a single-ended approach in estimating the phase resistance. Equations 12 and 13 similarly may be used to calculate the estimated resistances of Phase B ($R_{B\_EST}'$) and C ($R_{C\_EST}'$).

$$R_{A\_EST}' = \text{Real}\left(\frac{V_{AS} - V_{AR\_EST}' - (I_B + I_C) \cdot Z_M}{I_A}\right) \quad \text{Eq. 11}$$

$$R_{B\_EST}' = \text{Real}\left(\frac{V_{BS} - V_{BR\_EST}' - (I_A + I_C) \cdot Z_M}{I_B}\right) \quad \text{Eq. 12}$$

$$R_{C\_EST}' = \text{Real}\left(\frac{V_{CS} - V_{CR\_EST}' - (I_A + I_B) \cdot Z_M}{I_C}\right) \quad \text{Eq. 13}$$

Subtracting the actual phase resistance from the estimated phase resistance gives the corresponding estimated arc resistance during the occurrence of series arcing, as expressed in Equations 14, 15, and 16.

$$EARC\_RA = R_{A\_EST}' - R_{A\_SELF} \quad \text{Eq. 14}$$

$$EARC\_RB = R_{B\_EST}' - R_{B\_SELF} \quad \text{Eq. 15}$$

$$EARC\_RC = R_{C\_EST}' - R_{C\_SELF} \quad \text{Eq. 16}$$

where: $R_{A\_SELF}$, $R_{B\_SELF}$, and $R_{C\_SELF}$ are the Phase A, Phase B, and Phase C self resistances, respectively.

Under normal conditions, Equations 14, 15, and 16 are true and the estimated arc resistance values for each phase should be zero. However, for an occurrence of series arcing in one phase, the equation for the estimated arc resistance is only true for the affected phase. The estimated arc resistances for the remaining two phases are wrong because of the missing arc voltage drop in their equations. This is not a concern because the phases with incorrectly estimated arc resistance values can be easily eliminated. The estimated arc resistance value for the phase with series arcing should be positive and increase with time. So, any phase that has negative or steady values of estimated arc resistance is likely not the phase with series arcing. Alternatively, the phase current magnitudes can also be monitored while estimating the arc resistance values for each phase. The phase that has increasing values of estimated arc resistance and decreasing current magnitude is the one with series arcing.

Figure 7:
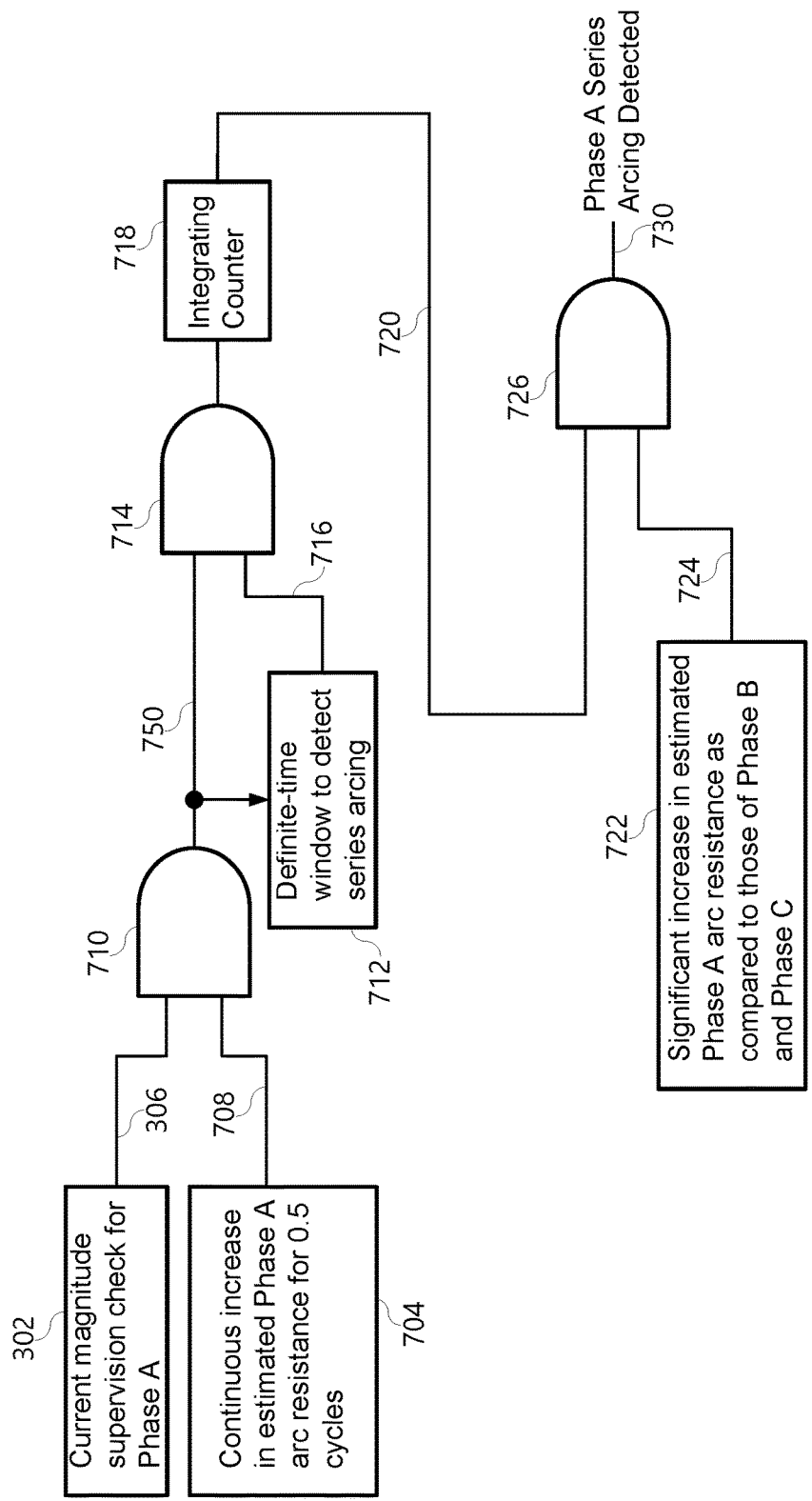
FIG. 7 illustrates a logic diagram for detecting a broken conductor using phase resistance.

Similar to FIG. 3 for current magnitude reduction, FIG. 7 illustrates a logic diagram for detecting a broken conductor using an increase in phase arc resistance. Instead of a block for determining a current reduction 304, a block for determining a continuous increase in estimated Phase A arc resistance for a predetermined period 704 asserts signal 708. The block 704 may require continuous increase in Phase A arc resistance without a similar increase in arc resistance for Phase B or Phase C. Upon assertion of signals 306 and 708, AND gate 710 asserts a suspected arcing phase signal 750 for the first phase (Phase A as illustrated). In various embodiments, a definite-time window is initiated 712 upon assertion of the suspected arcing phase signal 750, and the open window signal 716 is asserted. Upon assertion of the open window signal 716 and the suspected arcing phase signal 750, AND gate 714 asserts to initiate an integrating counter 718. The integrating counter 718 asserts signal 720 when the number of assertions of the suspected arcing phase signal 750 have been asserted during the time that the definite-time window is open 716. When signal 720 is asserted and a significant reduction in current magnitude for the suspected phase 722 has been satisfied (asserting signal 724), then AND gate 726 asserts signal 730 indicating a phase series arcing condition for the suspected phase (Phase A as illustrated).

Instead of determining a significant decrease in current reduction 322, the embodiment illustrated in FIG. 7 determines a significant increase in the estimated Phase A arc resistance as compared to those of Phase B and Phase C 722. If satisfied, block 722 asserts signal 724. As has been described, the increase may be between a present value of Phase A arc resistance and an initial value of Phase A arc resistance such as a value thereof before the broken conductor condition.

As with FIG. 3, the embodiment illustrated in FIG. 7 may be used to determine an arcing condition on Phase A. Similar methods are used to determine arcing conditions on remaining phases (e.g. Phase B, Phase C).

Figure 8A:
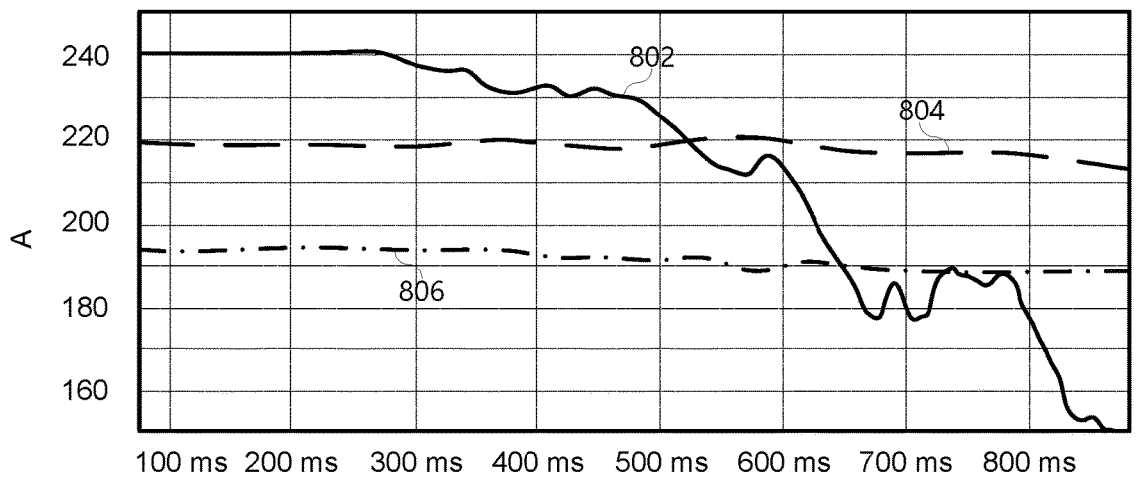
FIG. 8A illustrates a plot of phase currents during an A-phase broken conductor condition.
Figure 8B:
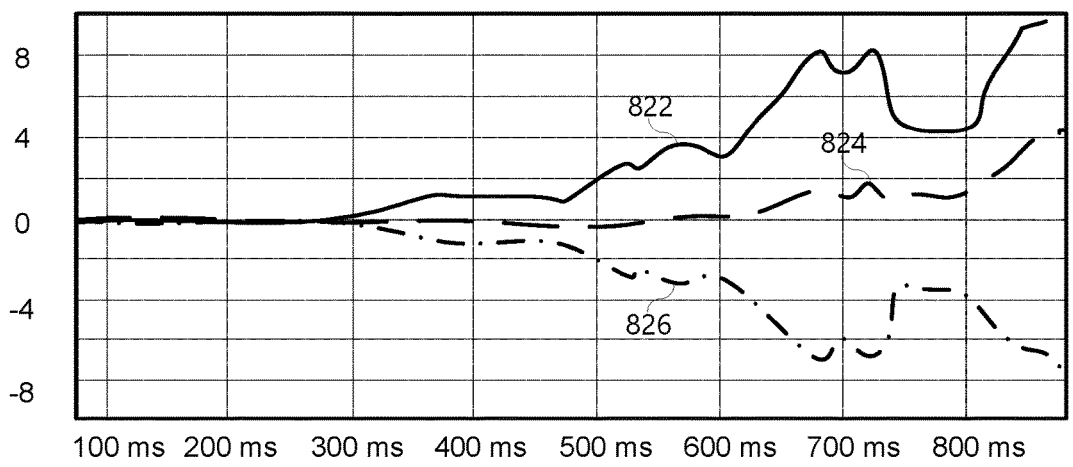
FIG. 8B illustrates a plot of phase resistances during an A-phase broken conductor condition.
Figure 8C:
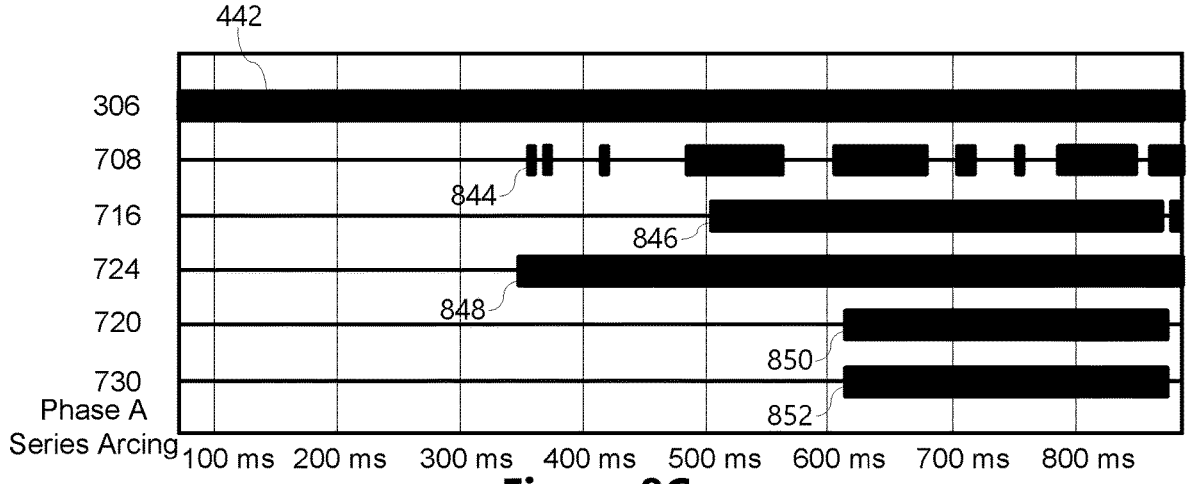
FIG. 8C illustrates a plot of logic signals during an A-phase broken conductor condition detected in accordance with several embodiments herein.
Figure 9:
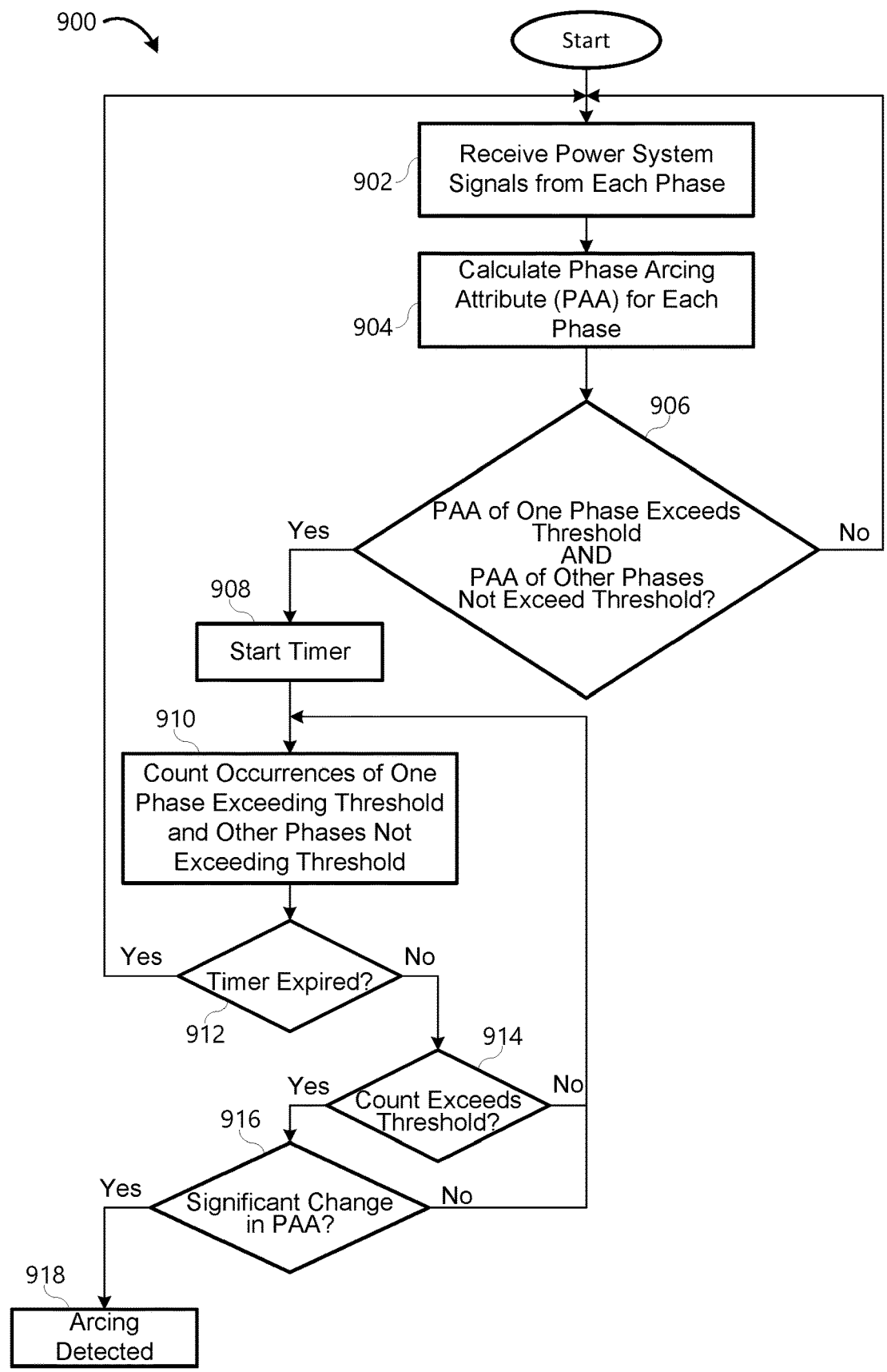
FIG. 9 illustrates a simplified method for detecting a broken conductor using a monitored arcing attribute in accordance with several embodiments herein.

FIGS. 8A, 8B, and 8C illustrate plots of current magnitude and arc resistance for each phase of a three-phase power system and assertion of signals 306, 708, 716, 720, 724, and 730 during a broken conductor event on Phase A. In particular, FIG. 8A illustrates plots of current magnitude for Phase A 802, Phase B 806, and Phase C 804. It can be seen that Phase A 802 experiences a reduction in current magnitude from the initiation of the series arc event at around 200 ms, whereas the current magnitudes of the other two phases 804, 806 do not experience such a reduction in current magnitude.

FIG. 8B illustrates the estimated phase arc resistance for Phase A 822, Phase B 826 and Phase C 824 calculated as described in accordance with the embodiments described hereinabove. It can be seen that the phase arc resistance for Phase A 822 increases without a commensurate increase in the other two phases. Indeed, Phase B is seen to venture into negative values, which clearly indicates that Phase B is not a phase undergoing phase series arcing.

Turning to FIG. 8C, the output of certain signals as illustrated in FIG. 3 is illustrated. Trace 442 is asserted for the entirety of the plot, as the current magnitude for Phase A exceeds the predetermined supervision threshold, resulting in assertion of signal 306. At around time 350 ms, signal 708 is asserted for the first time as seen in trace 844 indicating counts in increased phase A resistance. However, the duration of such increases is insufficient to initiate the definite-time window signal 716 as seen in trace 846 picking up at just after 500 ms. Trace 848 picks up at around 350 ms indicating that the phase resistance increase for Phase A has exceeded the predetermined threshold of block 722, and signal 724 has been asserted. At around time 620 ms, trace 850 indicates that the integrating counter 718 has asserted signal 720 due to a sufficient number of assertions of signal 750 while the timer is open (signal 716 and trace 846). Finally, upon assertion of signals 720 and 724, trace 852 illustrates assertion of signal 730 which indicates that series arcing on phase A has been determined.

It should be noted that certain methods of calculating arcing resistance are presented herein. However, other methods for calculating arc resistance may be used. For example, a fault resistance calculation using a previous voltage stored in memory instead of an estimated remote voltage may be used. Further, as suggested a remote voltage may be used. Similarly, a remote voltage stored in memory may be used.

Furthermore, while the above discloses embodiments specific to determining an open conductor by identifying a trend in current magnitude decrease in one phase or arc resistance increase in one phase but not the other phases, other phase series arcing attributes may be monitored to determine an open conductor condition. For example, the series arcing attribute may be impedance, which may be obtained from a power system as incremental real-time impedance. A trend of increase in impedance in one phase where the other phases do not exhibit the increase may be used to determine an open conductor condition in accordance with the several embodiments herein. In other embodiments, instead of a trend in incremental impedance, a present impedance may be compared with a previously-stored impedance. In various other embodiments, time domain current analog values may be used as the series arcing attributes, where a trend in one phase of such values that is not experienced in the other phases may indicate a series arcing condition in that phase.

While specific embodiments and applications of the disclosure have been illustrated and described, it is to be understood that the disclosure is not limited to the precise configurations and components disclosed herein. Moreover, principles described herein may also be utilized for distance protection and directional overcurrent protection. Accordingly, many changes may be made to the details of the above-described embodiments without departing from the underlying principles of this disclosure. The scope of the present invention should, therefore, be determined only by the following claims.

What is claimed is:

1. A system for detecting an open conductor of a first phase in a multiple-phase electric power delivery system, comprising:
   an intelligent electronic device (IED) receiving electric power delivery system signals from each phase of the multiple phases of the electric power delivery system; the IED including:
   a power system signal input for receiving the electric power delivery system signals, including current signals from each phase of the multiple phases;
   an open conductor element to:
      calculate a phase series arcing attribute for each phase of the multiple phases of the electric power delivery system using the electric power delivery system signals;
      compare a present value of the phase series arcing attribute for each phase with a previous value of the phase series arcing attribute for the respective phase to determine phase series arcing attribute differences for each phase;
      determine a suspected arcing phase for a first phase of the multiple phases when:
         the phase series arcing attribute difference for the first phase exceeds a predetermined threshold and;
         the phase series arcing attribute differences for all other phases of the multiple phases do not exceed the predetermined threshold; and
      determine a phase series arcing condition for the first phase when the suspected arcing phase is determined; and
   a protective action module to effect a protective action upon determination of the phase series arcing condition.

2. The system of claim 1, wherein the open conductor element is further configured to determine a current magnitude for each phase of the multiple phases, and determine the suspected arcing phase when the current magnitude for each phase exceeds a predetermined current magnitude supervision threshold and the phase series arcing condition is determined.

3. The system of claim 1, wherein the open conductor element is further configured to determine the suspected arcing phase when the phase series arcing attribute difference for the first phase exceeds the predetermined threshold for a predetermined period.

4. The system of claim 3, wherein the open conductor element is further configured to determine the suspected arcing phase when the phase series arcing attribute difference for all other phases do not exceed the predetermined threshold for the predetermined period.

5. The system of claim 1, wherein the open conductor element is further configured to determine the phase series arcing condition when the suspected arcing phase is determined for a predetermined number of counts.

6. The system of claim 5, wherein the predetermined number of counts is greater than a number of counts during a circuit breaker open event.

7. The system of claim 5, wherein the open conductor element is further configured to initiate a timer upon determination of the suspected arcing phase.

8. The system of claim 7, wherein the open conductor element is further configured to determine the phase series arcing condition when the suspected arcing phase is determined for the predetermined number of counts during a defined time of the timer.

9. The system of claim 8, wherein the defined time of the timer comprises 18 power system cycles.

10. The system of claim 7, wherein upon expiration of a defined time of the timer, the number of counts resets to zero.

11. The system of claim 1, wherein the phase series arcing condition is determined for the first phase when a difference between the present value of the arcing attribute and an initial value of the arcing attribute exceeds a predetermined overall difference threshold.

12. The system of claim 11, wherein the predetermined overall difference threshold comprises 25% of the initial value.

13. The system of claim 1, wherein the phase series arcing attribute comprises current magnitude and the phase series arcing attribute difference comprises a reduction in current magnitude.

14. The system of claim 1, wherein the phase arcing attribute comprises an arc resistance and the phase series arcing attribute difference comprises an increase in arc resistance.

15. The system of claim 14, wherein the open conductor element is configured to calculate the arc resistance using voltages from a first location of the electric power delivery system and voltages from a second location of the electric power delivery system.

16. The system of claim 14, wherein the open conductor element is configured to calculate the arc resistance using voltages from a first location of the electric power delivery system and estimates of voltages for a second location of the electric power delivery system.

17. The system of claim 14, wherein the open conductor element is configured to calculate the arc resistance using a pre-event voltage measurement from a first location of the electric power delivery system and present voltage measurements from the first location of the electric power delivery system.

18. The system of claim 3, wherein the predetermined time period comprises 0.5 power system cycles.

19. The system of claim 5, wherein the predetermined number of counts comprises 24 counts.

20. A method for detecting an open conductor of a first phase in a multiple-phase electric power delivery system, comprising:
- receiving, by an intelligent electronic device (IED), electric power delivery system signals from each of the multiple phases of the electric power delivery system, including current signals;
- calculating a phase series arcing attribute for each phase of the multiple phases of the electric power delivery system using the electric power delivery system signals;
- comparing a present value of the phase series arcing attribute for each phase with a previous value of the phase series arcing attribute for the respective phase to determine phase series arcing attribute differences for each phase;
- determining a suspected arcing phase for a first phase of the multiple phases when:
    - the phase series arcing attribute difference for the first phase exceeds a predetermined threshold and;
    - the phase series arcing attribute differences for all other phases of the multiple phases do not exceed the predetermined threshold;
- determining a phase series arcing condition for the first phase when the suspected arcing phase is determined; and
- effecting a protective action upon determination of the phase series arcing condition.

\* \* \* \* \*